United States Patent [19]

Chikawa et al.

[11] Patent Number: 5,336,650
[45] Date of Patent: Aug. 9, 1994

[54] METHOD OF MAKING TAPE CARRIER SEMICONDUCTOR DEVICE

[75] Inventors: Yasunori Chikawa, Kitakatsuragi; Yoshiaki Honda, Tenri; Katsunobu Mori, Nara; Naoyuki Tajima, Kitakatsuragi; Takaaki Tsuda, Tenri; Takamichi Maeda, Ikoma, all of Japan

[73] Assignee: Sharp Kabushiki Kaisha, Osaka, Japan

[21] Appl. No.: 112,315

[22] Filed: Aug. 27, 1993

Related U.S. Application Data

[62] Division of Ser. No. 796,431, Nov. 22, 1991, Pat. No. 5,281,848.

[30] Foreign Application Priority Data

Dec. 11, 1990 [JP] Japan .................................. 2-401252

[51] Int. Cl.⁵ .............................................. H01L 21/60
[52] U.S. Cl. ..................................... 437/209; 437/217; 257/793
[58] Field of Search ............... 437/209, 211, 217, 219; 257/783, 793

[56] References Cited

U.S. PATENT DOCUMENTS

| | | | |
|---|---|---|---|
| 4,143,456 | 3/1979 | Inoue | 29/588 |
| 4,300,153 | 11/1981 | Hayakawa et al. | 357/80 |
| 4,819,041 | 4/1989 | Redmond | 357/80 |
| 4,903,118 | 2/1990 | Iwade | 357/72 |
| 4,910,582 | 3/1990 | Miyamato et al. | 357/74 |
| 4,926,239 | 5/1990 | Fujita et al. | 357/72 |
| 5,194,695 | 3/1993 | Maslakow | 174/52.4 |
| 5,202,288 | 4/1993 | Doering et al. | 437/209 |
| 5,206,188 | 4/1993 | Hiroi et al. | 437/211 |
| 5,264,730 | 11/1993 | Matsuzaki et al. | 257/782 |
| 5,281,852 | 1/1994 | Normington | 257/685 |

FOREIGN PATENT DOCUMENTS 61-75549 4/1986 Japan .
61-115342 6/1986 Japan .

*Primary Examiner*—George Fourson
*Assistant Examiner*—Richard A. Booth
*Attorney, Agent, or Firm*—Nixon & Vanderhye

[57] ABSTRACT

A tape carrier semiconductor device has a resin sealed area not so larger than the size of the semiconductor chip, e.g. substantially not exceeding 2 mm to the outside. A device hole is not larger than an area formed by extending the outer periphery of the semiconductor chip to the outside by 0.3 mm and an epoxy resin of 500-1200 ps in viscosity is used for sealing the chip.

2 Claims, 4 Drawing Sheets

METHOD OF MAKING TAPE CARRIER SEMICONDUCTOR DEVICE

This is a division of application Ser. No. 07/796,431, filed Nov. 22, 1991, now U.S. Pat. No. 5,281,848.

BACKGROUND OF THE INVENTION

1. Field of the Invention

The present invention relates to a tape carrier semiconductor device, and, more particularly, to a tape carrier semiconductor device of a smaller external size capable of higher density mounting of semiconductor devices.

2. Description of the Related Art

Heretofore, sealing resins for tape carrier semi-conductor devices have been selected with priority being given to thinning the thickness of the resin applied to the semi-conductor devices. With respect to the viscosity of the resin, liquid resins having a viscosity ranging from 100 to 150 cps are widely used with the device hole size usually equal to the chip size plus 0.6–1.0 mm, and the size of the resulting resin sealed area being about the chip size plus 4–5 mm.

A technique capable of controlling the size of the resin sealed area to a range of the chip size plus 1–2 mm has not yet been available.

The size of a resin sealed area is mostly left to a natural phenomena e.s. after pouring a sealing resin, the natural extension of the sealing resin is allowed until the natural extension stops.

Viscosity of liquid resins used heretofore is so low that the area covered by the sealing resin extends too widely and its size is difficult to control.

Even if the resin viscosity is raised, the sealed area cannot be controlled to a desired size of area, and/or LSI chips cannot be fully covered so that there is a reliable problem.

For the purpose of controlling the size of a resin sealed area, there is a method of printing a paste sealing resin on the tape. Though this method can control the resin sealed area at the side of the chip on which the paste sealing resin is printed, it is difficult to control the extending area of the sealing resin flowing to opposite side of the chip through a gap between the LSI chip and the device hole.

SUMMARY OF THE INVENTION

An object of the present invention is to provide a tape carrier semiconductor device having a resin sealed area covering the semiconductor chip which is within an area formed by extending the outer periphery of the semi-conductor chip to the outside by 2 mm.

According to the present invention, there is provided a tape carrier semiconductor device which comprises a semiconductor chip set at a device hole provided in the tape carrier and sealed by applying an epoxy resin having a viscosity of 500–1200 ps (poises) thereto, the inner periphery of the device hole being within an area defined by the outer periphery of the semiconductor chip and a curve formed by extending the outer periphery of the semiconductor chip to the outside by 0.3 mm.

DESCRIPTION OF THE PREFERRED EMBODIMENTS

Figure 1:
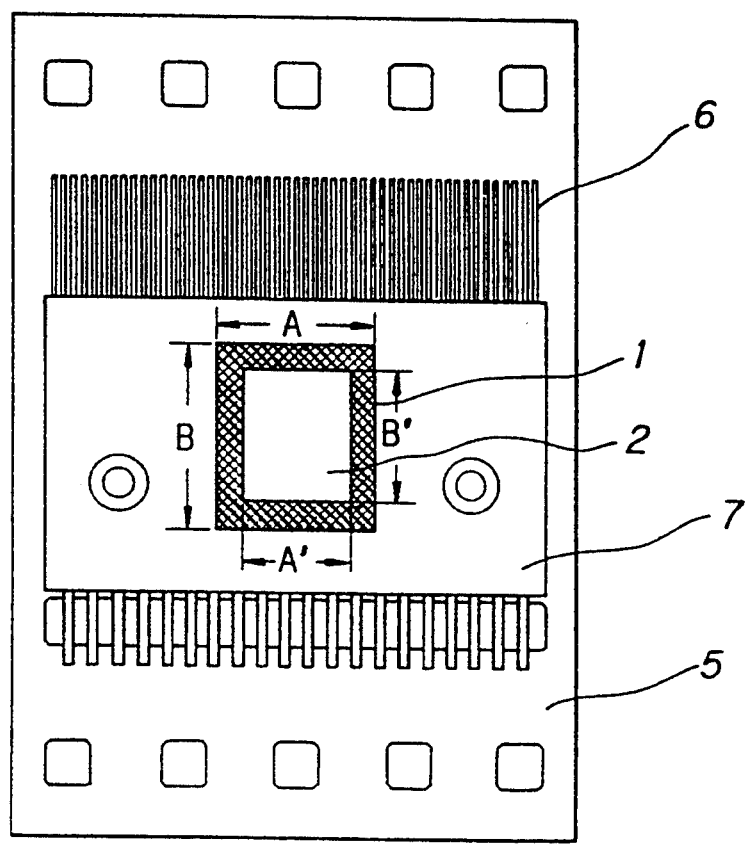
FIG. 1 is a plan view of a tape carrier semiconductor device sealed with an epoxy resin according to the present invention.

The present invention is explained in detail in the following referring to the drawings.

FIG. 1 illustrates a tape carrier semiconductor device sealed with an epoxy resin of the present invention.

A lead pattern 6 is provided on a substrate 5 by using an adhesive such as an epoxy resin, and further a solder resist 7, for example, composed of an epoxy resin, is furnished for protecting minute patterns and decreasing connecting resistances.

LSI chip 2 set at a device hole (not shown in FIG. 1, but corresponding to 4 in FIG. 2) is sealed with an epoxy resin 1 (crosshatched) having a viscosity of 500–1200 ps applied thereto. LSI chip 2 is also covered with the epoxy resin though any crosshatching is not given there for the purpose of clearly showing the position of LSI chip 2.

In FIG. 1, A' and B' represent the traverse and the longitudinal lengths of LSI chip 2, respectively and A and B represent the traverse and the longitudinal lengths of the resin sealed region, respectively. Each of $(A - A')/2$, $(B - B')/2$ and the distance between a vertex of LSI chip 2 and that of the resin sealed area corresponding to said vertex of LSI chip 2 is 2 mm or less.

Figure 2:
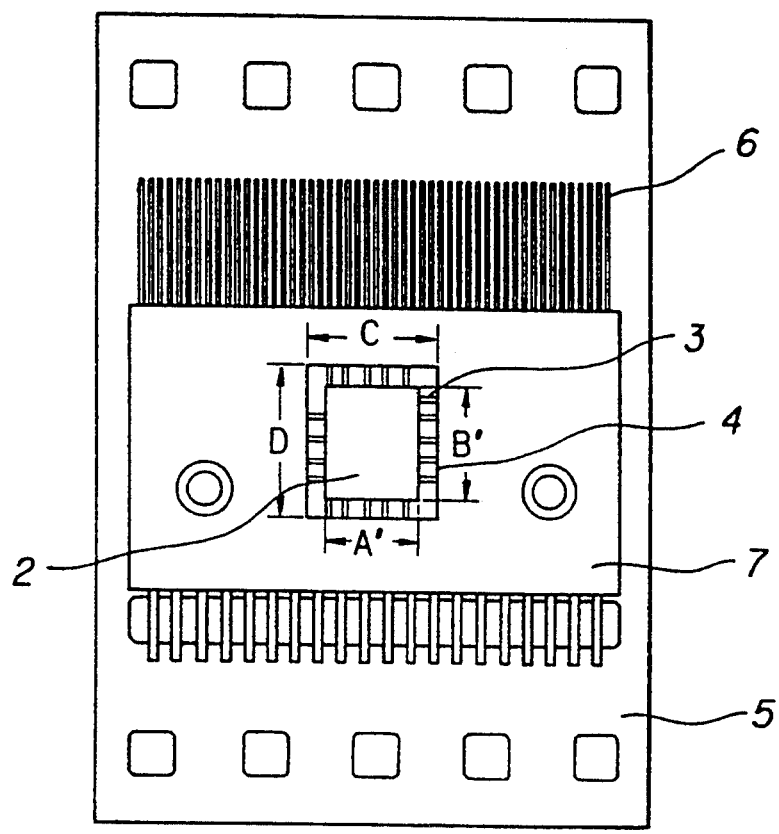
FIG. 2 is a plan view of a tape carrier semiconductor device of the present invention before sealed with an epoxy resin.

FIG. 2 shows a tape carrier semiconductor device of FIG. 1 which has not yet been sealed with the epoxy resin. In FIG. 1 and FIG. 2, like reference numerals show like parts.

LSI chip 2 is set at device mounting hole 4 and inner leads 3 are connected with LSI chip 2.

C and D represent the transverse and longitudinal dimensions of device hole 4, respectively, and A' and B' represent the transverse and longitudinal dimensions of LSI chip 2. Each of $(C - A')/2$, $(D - B')/2$ and the distance between a vertex of LSI chip 2 and a vertex of device hole 4 corresponding to the vertex of LSI chip 2 is 0.3 mm or less.

Figure 3:
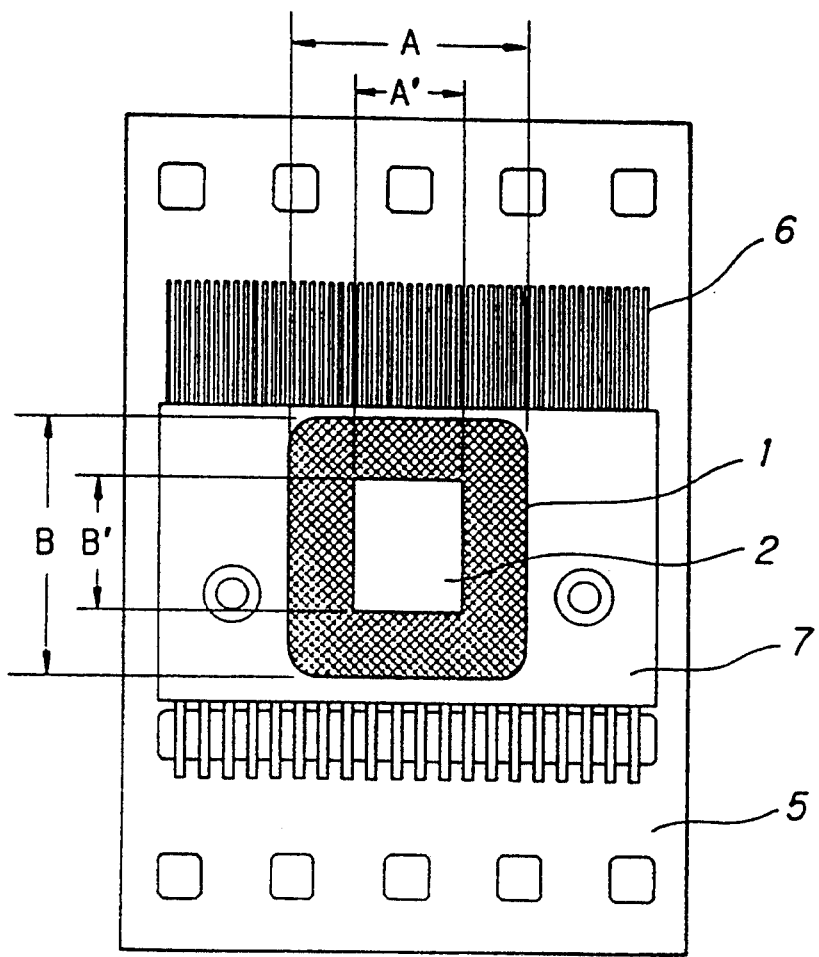
FIG. 3 is a plan view of a conventional type carrier semiconductor device sealed with a liquid resin.

FIG. 3 shows a conventional tape carrier semiconductor device in which LSI chip 2 has been sealed with a conventional liquid resin having a viscosity of 100–150 cps applied thereto. In FIG. 1 and FIG. 3, like reference numerals indicate like parts for ease of comparison.

In FIG. 3, A and B represent the transverse and longitudinal dimensions of the resin sealed region, respectively. A' and B' represent the transverse and longitudinal dimensions of LSI chip 2, respectively. Each of $(A - A')/2$ and $(B - B')/2$ exceeds 2 mm.

A feature of the present invention is that a particular range of viscosity of the sealing resin is used and the relation between the size of the device hole and the size of LSI chip is defined so as to control the resin sealed region.

Figure 4:
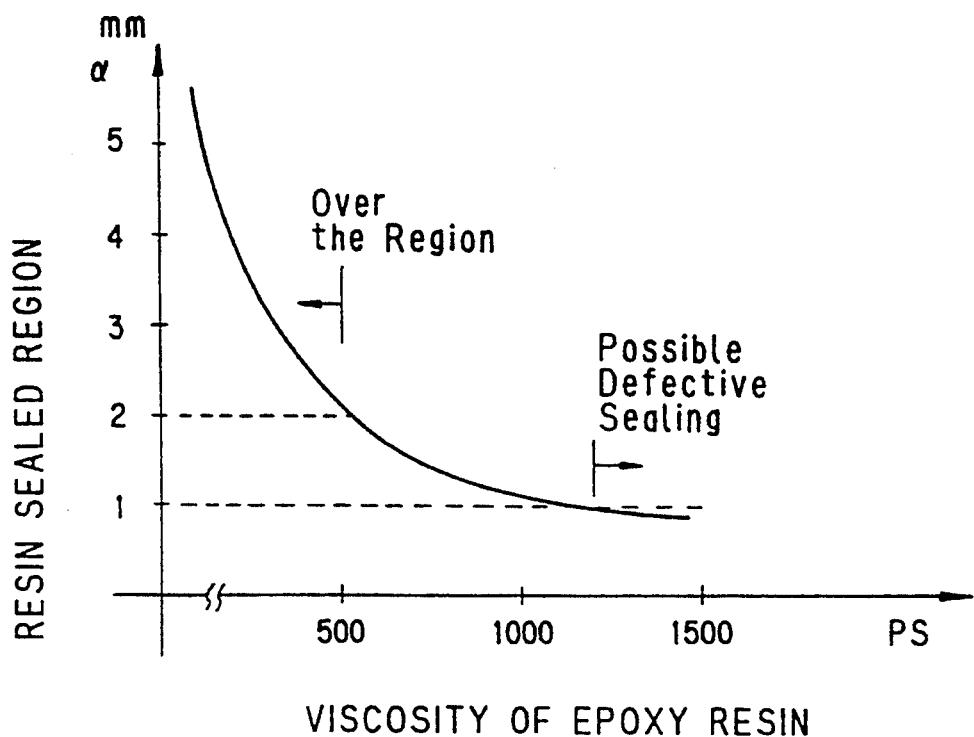
FIG. 4 is a graph showing the relationship between resin viscosity and resin sealed area.

FIG. 4 illustrates a relationship between the viscosity of an epoxy resin and the resin sealed region in the case where the device mounting hole size is equal to (chip size +0.2 mm) (i.e. the distance between the inner periphery of the device mounting hole and the outer periphery of the LSI chip being 0.2 mm).

The "α" in FIG. 4 stands for the distance between the outer periphery of the LSI chip and the outer periphery of the resin sealed region.

In FIG. 4, the resin viscosity giving the resin sealed region which is equal to (chip size +1 to 2 mm) (i.e. $\alpha = 1$ to 2 mm) is 500–1200 ps.

The lower limit of the resin sealed region is selected to be (chip size +1 mm) (i.e. $\alpha = 1$ mm) here since defective sealing is liable to occur when the resin sealed region is less than (chip size +1 mm).

The curve in the graph of FIG. 4 is obtained when the device mounting hole size is equal to (chip size +0.2 mm). However, a curve similar to the curve in FIG. 4 is obtained until the device mounting hole size increases to (chip size +0.3 mm) (i.e. the distance between the inner periphery of the device mounting hole and the outer periphery of the LSI chip).

When the epoxy resin viscosity is higher than the above-mentioned upper limit or the device mounting hole size is larger than the above-mentioned upper limit, the epoxy sealing resin can not completely cover the inner leads connecting with an LSI chip or with an LSI chip and a tape carrier pattern, and therefore, the reliability and the mechanical strength are problematic.

On the contrary, when the epoxy resin viscosity is lower than the lower limit, i.e. 500 ps, the resin sealed region extends too much.

When the gap between the LSI chip and the device mounting hole is too small, the epoxy resin for sealing cannot flow through the gap and thereby, can not reach the back surface of the LSI chip. Therefore, the reliability is problematic.

As a sealing resin, an epoxy resin having a viscosity of 500–1200 ps is used.

Representative epoxy resins are glycidyl ether type epoxy resins. Exemplary suitable epoxy resins are bisphenol A type epoxy resins, bisphenol F type epoxy resins, phenol novolaks type epoxy resins and the like.

Materials which are in contact with the epoxy sealing resin are, for example, substrates of the tape carrier. As the substrates, various materials may be used, and are usually resin materials. Exemplary suitable resin materials include polyimide resin films, glass epoxy substrates and polyester resin substrates.

In addition, as other materials in contact with the epoxy sealing resin, there may be mentioned a solder resist 7 as shown in FIG. 1.

According to the present invention, the degree of extension of the epoxy sealing resin having a viscosity of 500–1200 ps varies somewhat depending upon the kind of the material, but is not to much affected by resin kind of resin material.

The method of effecting sealing of the LSI chip with the epoxy sealing resin is not particularly critical. For example, the epoxy resin having a viscosity of 500–1200 ps may be dropped to the LSI chip.

The procedure for sealing the chip may be carried out following prior art procedures, for example, applying the epoxy resin to the chip and allowing it to extend naturally until its flow stops.

For example, an LSI chip of 1.3 mm×14 mm in size was put on a film carrier at a device mounting hole such that the gap between the inner periphery and the outer periphery of the chip was about 0.1 mm. Then about 13 mg of an epoxy resin having a viscosity of about 800 ps was dropped on the chip. The resulting resin sealed region was about 3.3 mm×16 mm in size.

It is not always necessary that the gap between the inner periphery of a device mounting hole and the outer periphery of a semiconductor chip is the same at every position of the periphery, as long as the gap size is within the range as defined in the present invention. For example, the gap size at a portion where the number of inner leads is smaller is made narrower than the gap size at a portion where the number of inner leads is larger. Such difference in gap size is desired so as to avoid nonuniform flows to the back surface of the chip due to the difference in the number of inner leads overhanging the device mounting hole.

As described above in detail, according to the present invention, the problem of the resin sealed region affecting the determination of the outer size of a tape carrier semiconductor device can be solved. As a result, there is produced a subminiature tape carrier semiconductor device of which resin sealed region is within an area formed by extending the periphery of the semiconductor chip to the outside by 2 mm.

For example, the present invention is particularly effective to decrease the resin sealed area in a liquid crystal driver so as to lessen the outer periphery of portions other than the display portion.

What is claimed is:

1. A method of making a tape carrier semiconductor device, said method comprising the steps of:
    connecting a semiconductor chip to conductive leads within a mounting hole in a tape carrier that provides a gap between the chip and hole edges that is no more than about 0.3 mm;
    thereafter applying to said chip and said gap an epoxy resin having a viscosity in the range of 500 to 1200 ps which resin is limited by its viscosity and by said gap size to extend when cured.

2. A method as in claim 1 wherein said gap size along the edges of said chip varies as a function of the density of conductive leads connected to said chip thereat.

* * * * *